United States Patent
Kimura et al.

(10) Patent No.: US 7,680,166 B2
(45) Date of Patent: Mar. 16, 2010

(54) LASER DRIVE, OPTICAL DISC APPARATUS, AND LASER-DRIVING METHOD

(75) Inventors: Motoi Kimura, Kanagawa (JP); Yasuyuki Takeshita, Tokyo (JP); Hidetaka Kodama, Kanagawa (JP)

(73) Assignee: Sony Corporation, Tokyo (JP)

( * ) Notice: Subject to any disclaimer, the term of this patent is extended or adjusted under 35 U.S.C. 154(b) by 115 days.

(21) Appl. No.: 11/299,788

(22) Filed: Dec. 13, 2005

(65) Prior Publication Data

US 2006/0153259 A1 Jul. 13, 2006

(30) Foreign Application Priority Data

Dec. 27, 2004 (JP) ............................. 2004-375730

(51) Int. Cl.
*H01S 3/00* (2006.01)
(52) U.S. Cl. ................................. 372/38.04; 372/38.02

(58) Field of Classification Search ............. 372/38.02, 372/31, 38, 26, 38.04
See application file for complete search history.

(56) References Cited

U.S. PATENT DOCUMENTS

| | | | | |
|---|---|---|---|---|
| 4,689,795 | A | * | 8/1987 | Yoshimoto et al. ............ 372/31 |
| 5,276,697 | A | * | 1/1994 | Davis ....................... 372/38.07 |
| 6,922,423 | B2 | * | 7/2005 | Thornton ................. 372/38.07 |

* cited by examiner

*Primary Examiner*—Minsun Harvey
*Assistant Examiner*—Patrick Stafford
(74) *Attorney, Agent, or Firm*—Oblon, Spivak, McClelland, Maier & Neustadt, L.L.P.

(57) ABSTRACT

A laser drive includes a variable output voltage source that can control an output voltage, a laser source connected to the variable output voltage source, a laser drive circuit that drives the laser source, and a monitoring controller that monitors an operating voltage of the laser drive circuit and controls the output of the variable output voltage source such that the monitored operating voltage becomes equal to a desired value.

11 Claims, 3 Drawing Sheets

LASER DRIVE, OPTICAL DISC APPARATUS, AND LASER-DRIVING METHOD

CROSS REFERENCES TO RELATED APPLICATIONS

The present invention contains subject matter related to Japanese Patent Application JP 2004-375730 filed in the Japanese Patent Office on Dec. 27, 2004, the entire contents of which are incorporated herein by reference.

BACKGROUND OF THE INVENTION

1. Field of the Invention

The present invention relates to a laser drive for driving a laser, an optical disc apparatus, and a laser-driving method.

2. Description of the Related Art

A typical optical disc apparatus includes an optical pickup having a semiconductor laser diode as a light source, and the semiconductor laser diode is generally driven by a laser drive.

The radiation power characteristic of the semiconductor laser diode varies depending on individual differences, the ambient temperature, and aging. FIG. 5 is a graph showing the characteristic of radiation power versus forward voltage of a semiconductor laser diode. As shown in the figure, the characteristic shown by the bold line in the graph shifts to those shown by thin lines depending on the ambient temperature, aging, etc., of the semiconductor laser diode. In addition to these factors, individual differences of the semiconductor laser diode also affect the radiation power characteristic. Accordingly, a voltage set for obtaining, for example, the radiation power shown by the dashed line in the figure varies.

FIG. 6 is a diagram showing the structure of a known laser drive that compensates for the characteristic variation. Referring to the figure, the laser drive includes a constant voltage source 60, a laser source 20, such as a semiconductor laser, and a laser drive circuit 70. A constant voltage $V_{LD}'$ and a current $I_{LD}'$ are supplied to the laser source 20 and the laser drive circuit 70 from the constant voltage source 60. A voltage $V_{op}'$ is applied between the terminals of the laser source 20, and a voltage $V_{tc}'$ is applied to the laser drive circuit 70. Here, the following equation is satisfied:

$$V_{LD}'=V_{op}'+V_{tc}' \quad (1)$$

In order to cause the laser source 20 to emit laser light with a desired radiation power, the laser drive circuit 70 adjusts $V_{tc}'$ ($V_{op}'$) and $I_{LD}'$ to control the energy supplied to the laser source 20 ($V_{op}'$, $I_{LD}'$).

However, since $V_{op}'$ varies depending on the radiation power, individual differences, the ambient temperature, aging, etc., of the laser source 20, $V_{LD}'$ is set to a voltage including an allowance to ensure that a sufficient voltage can be supplied even under the worst condition in a predetermined condition range. Therefore, $V_{LD}'$ is too high under normal conditions, and $V_{tc}'$ becomes relatively high as a result. Accordingly, the laser drive circuit 70 consumes excess power as thermal energy, which generates heat that reduces the reliability of the laser source 20 and other peripheral devices.

Japanese Unexamined Patent Application Publication No. 2003-168232 discloses a structure that suppresses an increase in the ambient temperature due to heat generated by a laser drive section by detecting the level of a laser operating voltage and controlling the level of a power source voltage supplied to the laser drive section such that power consumption of the laser drive section maintains constant. Accordingly, variation in the characteristic of current applied to a semiconductor laser versus amount of light emitted therefrom (I-L characteristic) due to the ambient temperature variation is reduced.

SUMMARY OF THE INVENTION

However, in the above-described known structure, when the amount of light (current) is small, the voltage is increased to keep the power consumption of the laser drive circuit constant even if the voltage condition of the laser drive circuit is satisfied. More specifically, although the power consumption of the laser drive circuit can be kept constant, the power consumption is increased since the voltage is not set to a minimum voltage required of the laser drive circuit. Therefore, there is still a problem that the efficiency is low and high heat is generated, which reduces the reliability of the laser and the ambient devices.

In light of the above situation, it is desirable to provide a laser drive including a laser drive circuit that can be driven at the minimum required constant voltage and that can reduce power consumption, an optical disc apparatus, and a laser-driving method.

According to an embodiment of the present invention, a laser drive includes a variable output voltage source that can control an output voltage, a laser source connected to the variable output voltage source, a laser drive circuit that drives the laser source, and a monitoring controller that monitors an operating voltage of the laser drive circuit and controls the output of the variable output voltage source such that the monitored operating voltage becomes equal to a desired value.

According to this embodiment of the present invention, the output voltage of the variable output voltage source is controlled such that the operating voltage of the laser drive circuit becomes equal to the desired value. Accordingly, the laser drive circuit can be driven at the minimum constant voltage that ensures the operation of the laser drive circuit. Therefore, the output voltage of the variable output voltage source and the voltage between the terminals of the laser source can be adjusted to adequate values and excess power consumed by the laser drive circuit as thermal energy can be reduced.

In the above-described laser drive, the desired value of the operating voltage of the laser drive circuit and a predetermined estimated change may be set for each of a plurality of operational states. When the operation state is changed, the monitoring controller updates a set value for the output voltage of the variable output voltage source determined such that the operating voltage of the laser drive circuit becomes equal to the desired value for the operational state before the change using the predetermined estimated change for the operational state after the change.

Accordingly, the laser drive circuit can be driven at the minimum required constant voltage in each of the operational states even when the output voltage of the variable output voltage source is suddenly changed as the operational state is changed.

The above-described laser drive may further include a radiation controller that detects the amount of laser light emitted from the laser source and controls the radiation power of the laser source such that the amount of laser light emitted from the laser source is kept constant.

According to another embodiment of the present invention, an optical disc apparatus that radiates laser light onto an optical disc to record and/or reproduce data includes a laser drive including a variable output voltage source that can control an output voltage, a laser source connected to the variable output voltage source, a laser drive circuit that drives the laser source, and a monitoring controller that monitors an operating voltage of the laser drive circuit and controls the output of the variable output voltage source such that the monitored operating voltage becomes equal to a desired value.

According to this embodiment of the present invention, the output voltage of the variable output voltage source is controlled such that the operating voltage of the laser drive circuit becomes equal to the desired value. Accordingly, the laser drive circuit can be driven at the minimum constant voltage that ensures the operation of the laser drive circuit. Therefore, the output voltage of the variable output voltage source and the voltage between the terminals of the laser source can be adjusted to adequate values and excess power consumed by the laser drive circuit as thermal energy can be reduced.

In the above-described optical disc apparatus, the desired value of the operating voltage of the laser drive circuit and a predetermined estimated change may be set for each of a plurality of operational states. When the operation state is changed, the monitoring controller updates a set value for the output voltage of the variable output voltage source determined such that the operating voltage of the laser drive circuit becomes equal to the desired value for the operational state before the change using the predetermined estimated change for the operational state after the change.

Accordingly, the laser drive circuit can be driven at the minimum required constant voltage in each of the operational states even when the output voltage of the variable output voltage source is suddenly changed as the operational state is changed.

In the above-described optical disc apparatus, the laser drive may further include a radiation controller that detects the amount of laser light emitted from the laser source and controls the radiation power of the laser source such that the amount of laser light emitted from the laser source is kept constant.

According to another embodiment of the present invention, a laser-driving method for driving a laser source connected to a variable output voltage source that can control an output voltage includes the steps of monitoring an operating voltage of a laser drive circuit and controlling the output of the variable output voltage source such that the monitored operating voltage becomes equal to a desired value.

According to this embodiment of the present invention, the output voltage of the variable output voltage source is controlled such that the operating voltage of the laser drive circuit becomes equal to the desired value. Accordingly, the laser drive circuit can be driven at the minimum constant voltage that ensures the operation of the laser drive circuit. Therefore, the output voltage of the variable output voltage source and the voltage between the terminals of the laser source can be adjusted to adequate values and excess power consumed by the laser drive circuit as thermal energy can be reduced.

In the above-described laser-driving method, the desired value of the operating voltage of the laser drive circuit and a predetermined estimated change may be set for each of a plurality of operational states. When the operation state is changed, a set value for the output voltage of the variable output voltage source determined such that the operating voltage of the laser drive circuit becomes equal to the desired value for the operational state before the change is updated using the predetermined estimated change for the operational state after the change.

Accordingly, the laser drive circuit can be driven at the minimum required constant voltage in each of the operational states even when the output voltage of the variable output voltage source is suddenly changed as the operational state is changed.

DESCRIPTION OF THE PREFERRED EMBODIMENTS

Embodiments of the present invention will be described below with reference to the accompanying drawings.

Figure 1:
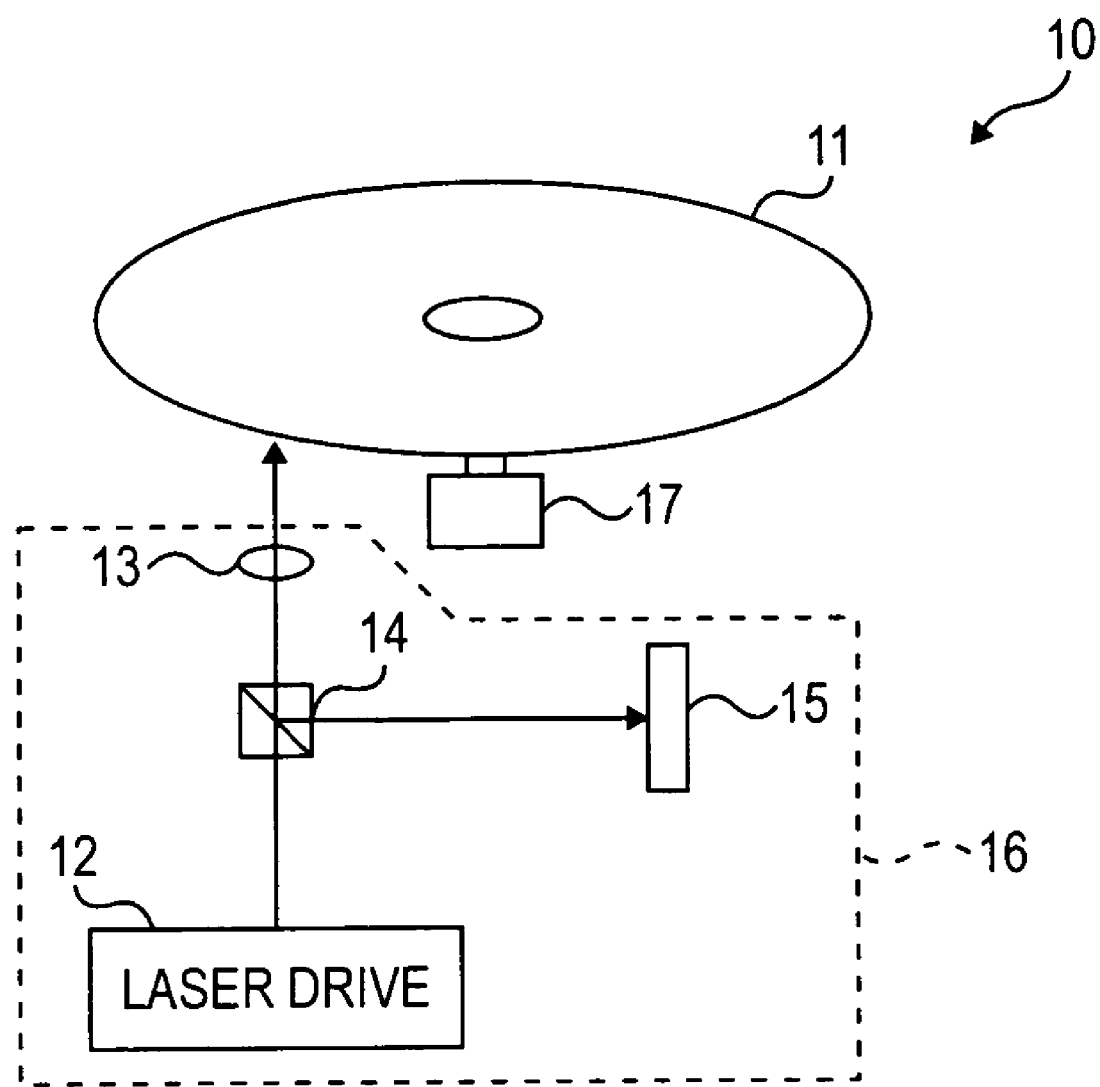
FIG. 1 is a diagram illustrating the structure of an optical disc apparatus according to an embodiment of the present invention.

FIG. 1 is a schematic diagram of an optical disc apparatus 10 according to an embodiment of the present invention. The optical disc apparatus 10 radiates laser light onto an optical disc 11, thereby recording data on the optical disc 11 or reproducing data recorded on the optical disc 11.

As shown in FIG. 1, the optical disc apparatus 10 includes an optical pickup 16 having a laser drive 12, an objective lens 13, a beam splitter 14, and a photodetector 15, and a disc-rotating device 17.

Figure 2:
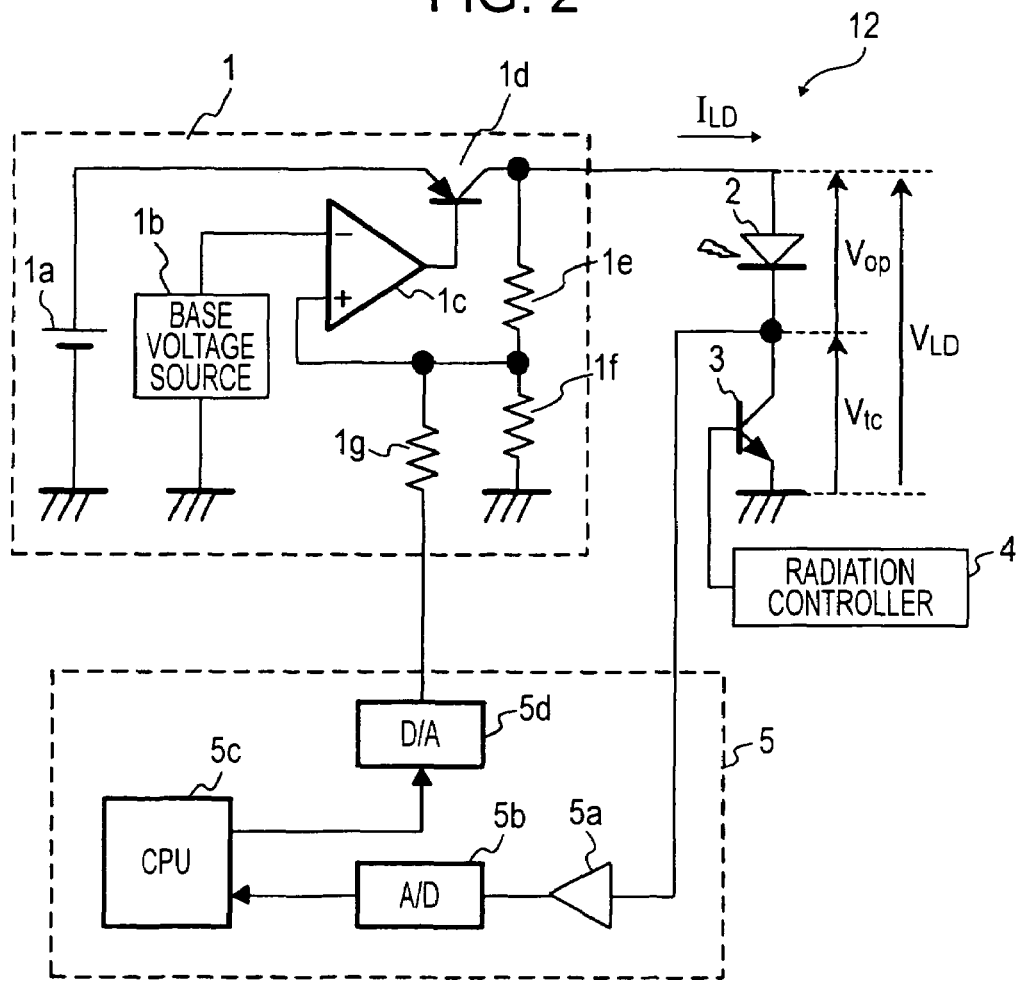
FIG. 2 is a diagram illustrating the structure of a laser drive according to the embodiment of the present invention.

FIG. 2 is a diagram illustrating the structure of the laser drive 12 according to the present embodiment.

As shown in FIG. 2, the laser drive 12 includes a variable output voltage source 1 that can control an output voltage thereof, a laser source 2, such as a semiconductor laser diode, a laser drive circuit 3 that drives the laser source 2, a radiation controller 4 that controls the laser drive circuit 3, and a monitoring controller 5 that monitors an operating voltage $V_{tc}$ of the laser drive circuit 3 and controls the variable output voltage source 1 such that the operating voltage $V_{tc}$ becomes equal to a reference voltage $V_{rf}$ which is a desired voltage of the laser drive circuit 3. In addition, in FIG. 2, $V_{LD}$ and $I_{LD}$ are an output voltage and an output current, respectively, of the variable output voltage source 1, $V_{op}$ is a voltage applied between the terminals of the laser source 2, and $V_{tc}$ is the operating voltage of the laser drive circuit 3.

The variable output voltage source 1 includes a constant voltage source 1a, a base voltage source 1b, a comparator 1c that compares a base voltage of the base voltage source 1b and a voltage corresponding to a control input from the monitoring controller 5, a PNP transistor 1d that controls the output voltage of the constant voltage source 1a on the basis of the result of comparison performed by the comparator 1c, and resistors 1e, 1f, and 1g.

The laser drive circuit 3 includes, for example, a transistor having a collector connected to a cathode of the semiconductor laser diode that functions as the laser source 2, a grounded emitter, and a base that receives a control signal from the radiation controller 4.

The radiation controller 4 includes, for example, an automatic power control (APC) circuit that monitors the amount of light emitted from the laser source 2 with a photodetector or the like and controls the radiation power of the laser source 2 by controlling the laser drive circuit 3 such that the monitored amount of light is maintained constant. However, according to the present invention, the laser drive circuit 3 is not limited to those including the APC circuit.

The monitoring controller 5 includes a bottom hold circuit 5a that holds a bottom value of the operating voltage $V_{tc}$ of the laser drive circuit 3, an A/D converter 5b that performs analog-to-digital (A/D) conversion of the bottom value of the operating voltage $V_{tc}$ held by the bottom hold circuit 5a, a central processing unit (CPU) 5c that obtains data of the operating voltage $V_{tc}$ of the laser drive circuit 3 from the A/D converter 5b and determines a set value for the output voltage $V_{LD}$ of the variable output voltage source 1 such that the obtained operating voltage $V_{tc}$ becomes equal to the reference voltage $V_{rf}$ which is a desired voltage of the laser drive circuit 3, and a D/A converter 5d that performs digital-to-analog (D/A) conversion of the set value calculated by the CPU 5c and feeds the set value to the variable output voltage source 1 as a control input.

Next, the operation of the laser drive 12 according to the present embodiment will be described below.

When the laser source 2 emits light, the voltage $V_{op}$ is applied between the terminals of the laser source 2. The voltage $V_{op}$ varies depending on various conditions including individual differences of the laser source 2, the amount of light emitted, the ambient temperature, aging, etc. Accordingly, the operating voltage $V_{tc}$ of the laser drive circuit 3 also varies in accordance with the variation of the voltage $V_{op}$.

The CPU 5c included in the monitoring controller 5 receives the operating voltage $V_{tc}$ of the laser drive circuit 3 via the bottom hold circuit 5a and the A/D converter 5b, and calculates the set value for the output voltage $V_{LD}$ of the variable output voltage source 1 such that the operating voltage $V_{tc}$ becomes equal to the reference voltage $V_{rf}$ which is the desired value thereof. The calculated set value is subjected to D/A conversion by the D/A converter 5d, and is supplied to the variable output voltage source 1 as the control input. Accordingly, a control voltage corresponding to the above-described set value is applied to a non-inverting input terminal of the comparator 1c included in the variable output voltage source 1. The difference between the control voltage and the base voltage of the base voltage source 1b supplied to an inverting input of the comparator 1c is applied to the base of the PNP transistor 1d, and thus the output voltage $V_{LD}$ of the variable output voltage source 1 is controlled.

Figure 3:
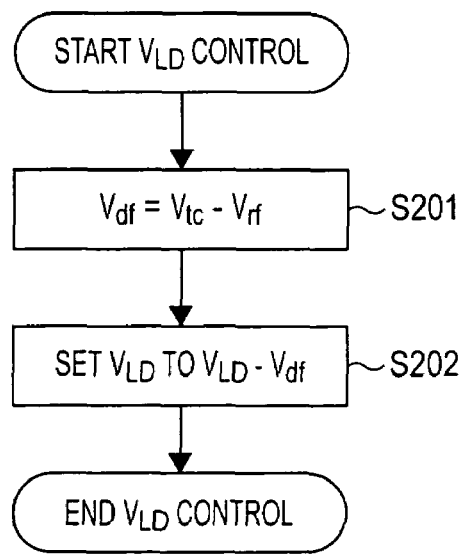
FIG. 3 is a flowchart of a process of $V_{LD}$ control performed by the laser drive shown in FIG. 2.

FIG. 3 is a flowchart showing a process of controlling the output voltage $V_{LD}$ performed by the monitoring controller 5. When the CPU 5c receives the operating voltage $V_{tc}$ of the laser drive circuit 3, the CPU 5c calculates a difference $V_{df}$ between the operating voltage $V_{tc}$ and the reference voltage $V_{rf}$ which is the desired voltage, as follows (Step 201):

$$V_{df} = V_{tc} - V_{rf} \quad (2)$$

Next, the new set value for the output voltage $V_{LD}$ is calculated from this difference $V_{df}$ as follows:

$$V_{LD}(\text{set value}) = V_{LD}(\text{previous set value}) - V_{df} \quad (3)$$

The new set value for the output voltage $V_{LD}$ is supplied to the variable output voltage source 1 as the control input (Step 202).

The above-described steps are repeated once every few seconds.

Thus, the operating voltage $V_{tc}$ of the laser drive circuit 3 is monitored and the output voltage $V_{LD}$ of the variable output voltage source 1 is controlled such that the operating voltage $V_{tc}$ becomes equal to the reference voltage $V_{rf}$ which is the desired voltage. Accordingly, the laser drive circuit 3 can be driven at the minimum constant voltage that ensures the operation of the laser drive circuit 3. Therefore, the output voltage $V_{LD}$ of the variable output voltage source 1 and the voltage $V_{op}$ between the terminals of the laser source 2, which have the relationship expressed by Equation (1) with the operating voltage $V_{tc}$ of the laser drive circuit 3, can be adjusted to adequate values and excess power consumed by the laser drive circuit 3 as thermal energy can be reduced. In addition, since the laser drive circuit 3 is driven at the minimum voltage that ensures the operation of the laser drive circuit 3 and heat generation is reduced, the lives of the laser drive circuit 3 and peripheral components including the laser source 2 and the reliability thereof can be increased.

In addition, according to the present embodiment, the laser drive 12 monitors the operating voltage $V_{tc}$ of the laser drive circuit 3. Therefore, compared to the case in which the voltage $V_{op}$ between the terminals of the laser source 2 is monitored to perform a similar control, the following advantages can be obtained.

That is, if the voltage $V_{op}$ between the terminals of the laser source 2 is monitored, means for determining the absolute value of $V_{LD}$ and means for calculating $V_{tc}$ from $V_{op}$ and $V_{LD}$ are provided. For example, such calculations are performed by the CPU 5c or a differential voltage output circuit or the like is provided. In comparison, according to the present embodiment, the structure can be made simpler since the operating voltage $V_{tc}$ is directly monitored.

In addition, if the voltage $V_{op}$ between the terminals of the laser source 2 is monitored, a monitoring structure that covers the variation range of the voltage $V_{op}$ is provided since the voltage $V_{op}$ varies depending on the radiation power, temperature, aging (deterioration), etc. In comparison, according to the laser drive of the present embodiment, the desired value of the operating voltage $V_{tc}$ of the laser drive circuit 3 is constant even though the voltage $V_{op}$ between the terminals of the laser source 2 and the output voltage $V_{LD}$ of the variable output voltage source 1 vary depending on the radiation power, temperature, aging (deterioration), etc. Therefore, the monitoring voltage range is small and accordingly the structure can be made simpler.

In addition, if the voltage $V_{op}$ between the terminals of the laser source 2 is monitored, the operating voltage $V_{tc}$ varies due to influences of an error of the output voltage $V_{LD}$ of the variable output voltage source 1 and a contact resistance of a connector. In comparison, when the operating voltage $V_{tc}$ of the laser drive circuit 3 is monitored, the operating voltage $V_{tc}$ is not easily influenced by the above-mentioned factors. Therefore, the accuracy can be increased.

According to the present embodiment, $V_{tc}$, which is the load-side voltage of the laser drive circuit 3, is directly monitored and kept constant, so that various characteristics, in particular the frequency characteristic, of the laser drive circuit 3 are stable. Therefore, stable laser pulse radiation characteristic can be obtained.

In the present embodiment, the monitoring controller 5 includes the CPU 5c as means for determining the set value for the output voltage $V_{LD}$ of the variable output voltage source 1 such that the operating voltage $V_{tc}$ of the laser drive circuit 3 becomes equal to the reference voltage $V_{rf}$ which is the desired voltage. However, a similar function may also be provided by an analog circuit. In addition, although the monitoring controller 5 includes the A/D converter 5b as means for detecting the operating voltage $V_{tc}$ of the laser drive circuit 3, a simple comparator may also be included instead.

According to the laser drive of the present embodiment, the laser drive circuit can be driven at the minimum required constant voltage. Therefore, power consumption is reduced and reduction in reliability due to heat generation can be prevented.

Next, as another embodiment of the present invention, a laser drive including a laser source 2 having a plurality of radiation power states will be described below. The hardware structure of the laser drive according to this embodiment is the same as that shown in FIG. 2, and explanations thereof are thus omitted.

In a laser drive included in the optical disc apparatus 10 that records and/or reproduces data on the optical disc 11, the radiation power of the laser source 2 differs depending on the operation state, i.e., depending on whether the recording operation or the reproducing operation is being performed. More specifically, both the operating voltage $V_{tc}$ of the laser drive circuit 3 and the set value for the voltage $V_{op}$ between the terminals of the laser source 2 have different ranges for each of the recording operation and the reproducing operation.

Accordingly, when the monitoring controller 5 receives a signal indicating that the operational state is changed from recording to reproducing or from reproducing to recording from a higher-order controller, the monitoring controller 5 updates the set value for the output voltage $V_{LD}$ of the variable output voltage source 1 obtained on the basis of the desired voltage of the laser drive circuit 3. More specifically, the set value is updated using a predetermined estimated change corresponding to the operational state after the change, and is then supplied to the variable output voltage source 1 as the control input.

Figure 4:
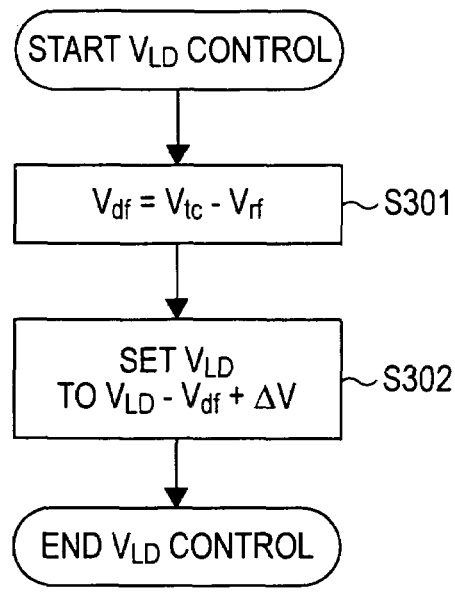
FIG. 4 is a flowchart of a process of $V_{LD}$ control performed by a laser drive according to another embodiment of the present invention.
Figure 5:
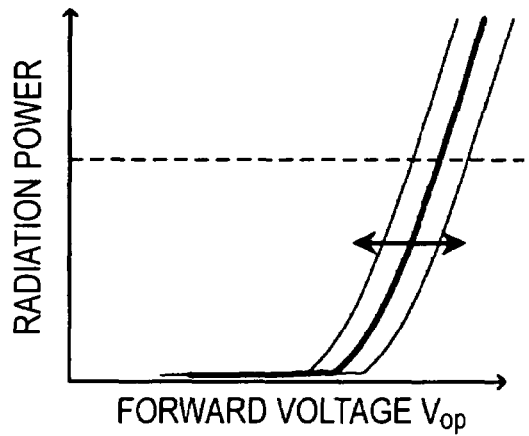
FIG. 5 is a graph showing the characteristic of radiation power versus forward voltage of a semiconductor laser diode.
Figure 6:
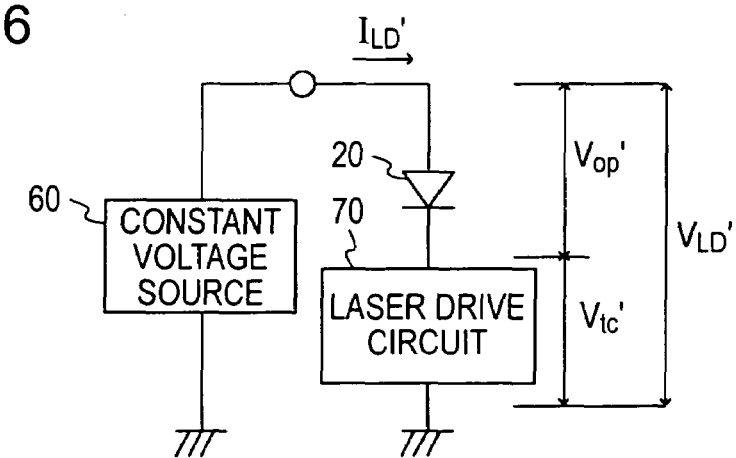
FIG. 6 is a diagram illustrating the structure of a known laser drive.

FIG. 4 is a flowchart showing a process of controlling the output voltage $V_{LD}$ according to the present embodiment. When the CPU 5c receives a signal indicating that the next radiation power state is changed from recording to reproducing or from reproducing to recording from a higher-order controller, the CPU 5c receives the operating voltage $V_{tc}$ of the laser drive circuit 3 and calculates a difference $V_{df}$ between the operating voltage $V_{tc}$ and the reference voltage $V_{rf}$, which is the desired voltage for the current operational state, from Equation (2) (Step 301).

Next, a set value for the output voltage $V_{LD}$ of the variable output voltage source 1 used when the operational state is changed is determined from the calculated difference $V_{df}$, the previous set value for the output voltage $V_{LD}$, and a predetermined estimated change $\Delta V$ corresponding to the operational state after the change (i.e., an estimated change for when the operational state is changed from recording to reproducing or an estimated change for when the operational state is changed from reproducing to recording) as follows:

$$V_{LD}(\text{set value}) = V_{LD}(\text{previous set value}) - V_{df} + \Delta V \quad (4)$$

The thus obtained set value is supplied to the variable output voltage source 1 as the control input (Step 302).

Accordingly, the laser drive circuit 3 can be driven at the minimum required constant voltage in both the recording and reproducing operations even when the output voltage $V_{LD}$ of the variable output voltage source 1 is suddenly changed as the operational state is changed between recording and reproducing.

According to the laser drive of the present embodiment, the laser drive circuit can be driven at the minimum required constant voltage. Therefore, power consumption is reduced and reduction in reliability due to heat generation can be prevented.

The present invention is not limited to the above-described embodiments, and various modifications, combinations, sub-combinations and alterations may occur with respect to structures, functions, operations, end effects thereof depending on design requirements and other factors insofar as they are within the scope of the appended claims or the equivalents thereof.

What is claimed is:

1. A laser drive, comprising:
   a variable output voltage source provided to control an output voltage;
   a laser source connected to the variable output voltage source;
   a laser drive circuit that drives the laser source; and
   a monitoring controller that directly monitors an operating voltage of an element of the laser drive circuit exclusively, and controls the output of the variable output voltage source such that the monitored operating voltage becomes equal to a desired value.

2. The laser drive according to claim 1, wherein the desired value of the operating voltage of the laser drive circuit and a predetermined estimated change are set for each of a plurality of operational states, and
   wherein, when an operational state changes, the monitoring controller updates a set value for the output voltage of the variable output voltage source determined such that the operating voltage of the element of the laser drive circuit becomes equal to the desired value for the operational state before the change using the predetermined estimated change for the operational state after the change.

3. The laser drive according to claim 1, further comprising:
   a radiation controller provided to detect an amount of laser light emitted from the laser source and controls radiation power of the laser source such that the amount of laser light emitted from the laser source remains constant.

4. An optical disc apparatus that radiates laser light onto an optical disc to record and/or reproduce data, comprising:
   a laser drive including a variable output voltage source provided to control an output voltage;
   a laser source connected to the variable output voltage source;
   a laser drive circuit that drives the laser source; and
   a monitoring controller that directly monitors an operating voltage of an element of the laser drive circuit exclusively, and controls the output of the variable output voltage source such that the monitored operating voltage becomes equal to a desired value.

5. The optical disc apparatus according to claim 4, wherein the desired value of the operating voltage of the laser drive circuit and a predetermined estimated change are set for each of a plurality of operational states, and
   wherein, when an operational state changes, the monitoring controller updates a set value for the output voltage of the variable output voltage source determined such that the operating voltage of the element of the laser drive circuit becomes equal to the desired value for the operational state before the change using the predetermined estimated change for the operational state after the change.

6. The optical disc apparatus according to claim 4, wherein the laser drive further comprises:
   a radiation controller provided to detect an amount of laser light emitted from the laser source and controls radiation power of the laser source such that the amount of laser light emitted from the laser source remains constant.

7. A laser-driving method for driving a laser source connected to a variable output voltage source that can control an output voltage, the laser-driving method comprising:

monitoring, directly, an operating voltage of an element of the laser drive circuit exclusively; and controlling the output of the variable output voltage source such that the monitored operating voltage becomes equal to a desired value.

8. The laser-driving method according to claim 7, wherein the desired value of the operating voltage of the laser drive circuit and a predetermined estimated change are set for each of a plurality of operational states, and wherein, when an operational state changes, a set value for the output voltage of the variable output voltage source determined such that the operating voltage of the element of the laser drive circuit becomes equal to the desired value for the operational state before the change is updated using the predetermined estimated change for the operational state after the change.

9. The laser drive according to claim 1, wherein the desired value is a minimum voltage that ensures operation of the laser drive circuit.

10. The optical disc apparatus according to claim 4, wherein the desired value is a minimum voltage that ensures operation of the laser drive circuit.

11. The laser-driving method according to claim 7, wherein the desired value is a minimum voltage that ensures operation of the laser drive circuit.

* * * * *